United States Patent
Ashworth et al.

(10) Patent No.: US 8,909,132 B2
(45) Date of Patent: Dec. 9, 2014

(54) BI-DIRECTIONAL AMPLIFIER WITH A COMMON AMPLIFICATION PATH

(71) Applicant: Wilson Electronics, LLC, St. George, UT (US)

(72) Inventors: Christopher K. Ashworth, St. George, UT (US); James W. Wilson, Diamond Valley, UT (US); Patrick L. Cook, St. George, UT (US); James Colin Clark, Washington, UT (US)

(73) Assignee: Wilson Electronics, LLC, St. George, UT (US)

( * ) Notice: Subject to any disclaimer, the term of this patent is extended or adjusted under 35 U.S.C. 154(b) by 0 days.

(21) Appl. No.: 13/837,174

(22) Filed: Mar. 15, 2013

(65) Prior Publication Data

US 2014/0266425 A1    Sep. 18, 2014

(51) Int. Cl.
*H04B 3/36* (2006.01)
*H03F 3/68* (2006.01)
*H03F 3/62* (2006.01)

(52) U.S. Cl.
CPC ... *H03F 3/62* (2013.01); *H03F 3/68* (2013.01)
USPC .................. 455/7; 455/78; 455/84; 455/11.1

(58) Field of Classification Search
CPC ............................ H04W 92/02; H04B 10/2971
USPC .............. 455/423, 15, 7, 11.1, 14, 20, 24, 69, 455/572, 13.1, 450, 78, 75, 73, 84, 67.11; 330/251, 277, 286; 359/341.2, 341.44; 370/342
See application file for complete search history.

(56) References Cited

U.S. PATENT DOCUMENTS

| | | | |
|---|---|---|---|
| 2004/0166802 A1* | 8/2004 | McKay et al. | 455/15 |
| 2005/0026571 A1* | 2/2005 | Yang et al. | 455/78 |
| 2006/0205442 A1* | 9/2006 | Phillips et al. | 455/572 |
| 2009/0289739 A1* | 11/2009 | Sasaki et al. | 333/132 |

* cited by examiner

*Primary Examiner* — John J Lee
(74) *Attorney, Agent, or Firm* — Maschoff Brennan

(57) ABSTRACT

According to some embodiments described herein, a bi-directional amplifier may include a first interface port configured to receive a first signal. The bi-directional amplifier may also include a second interface port. The second interface port may be communicatively coupled to the first interface port and may be configured to receive a second signal. The second interface port may be communicatively coupled to the first interface port such that the first signal propagates from the first interface port to the second interface port and such that the second signal propagates from the second interface port to the first interface port. The bi-directional amplifier may also include a common amplifier communicatively coupled between the first interface port and the second interface port such that the common amplifier is configured to receive and amplify both the first signal and the second signal.

20 Claims, 8 Drawing Sheets

BI-DIRECTIONAL AMPLIFIER WITH A COMMON AMPLIFICATION PATH

FIELD

The present disclosure relates to a bi-directional amplifier with a common amplification path.

BACKGROUND

Bi-directional amplifiers may be used to amplify signals that may propagate in different directions. As such, bi-directional amplifiers are commonly used with signal boosters. Signal boosters may be used to increase the quality of wireless communication between a wireless device and a wireless communication access point. Signal boosters may improve the quality of the wireless communication by amplifying, filtering, and/or applying other processing techniques to uplink and downlink signals communicated between the wireless device and the wireless communication access point.

The subject matter claimed herein is not limited to embodiments that solve any disadvantages or that operate only in environments such as those described above. Rather, this background is only provided to illustrate one example technology area where some embodiments described herein may be practiced.

SUMMARY

According to some embodiments described herein, a bi-directional amplifier may include a first port configured to receive a first signal. The bi-directional amplifier may also include a second interface port. The second interface port may be communicatively coupled to the first port and may be configured to receive a second signal. The second interface port may be communicatively coupled to the first port such that the first signal propagates from the first port to the second interface port and such that the second signal propagates from the second interface port to the first port. The bi-directional amplifier may also include a common amplifier communicatively coupled between the first port and the second interface port such that the common amplifier is configured to receive and amplify both the first signal and the second signal.

The object and advantages of the embodiments will be realized and achieved at least by the elements, features, and combinations particularly pointed out in the claims. It is to be understood that both the foregoing general description and the following detailed description are exemplary and explanatory and are not restrictive of the invention, as claimed.

BRIEF DESCRIPTION OF THE DRAWINGS

Example embodiments will be described and explained with additional specificity and detail through the use of the accompanying drawings in which.

DESCRIPTION OF EMBODIMENTS

According to some embodiments described herein, a bi-directional signal booster (referred to hereinafter as a "signal booster") may be configured to apply a gain to both uplink and downlink signals communicated within a wireless communication system. As detailed below, the signal booster may be configured such that both the uplink and downlink signals propagate within a common amplification path of the signal booster. The common amplification path may include one or more common amplifiers that may each receive and apply a gain to both the uplink and downlink signals. In contrast, traditional signal boosters may include an uplink amplification path or a downlink application path that may be configured such that they only apply a gain to uplink signals or downlink signals, but not both. Configuring the signal booster such that the same amplifiers may be used to apply a gain to both the uplink and downlink signals may reduce a number of components used in the signal booster, a size of a printed circuit board (PCB) associated with the signal booster, a number of PCB layers, etc.

The term "uplink" may refer to communications that are transmitted to the access point from the wireless device. The term "downlink" may refer to communications that are transmitted to the wireless device from the access point.

Figure 1:
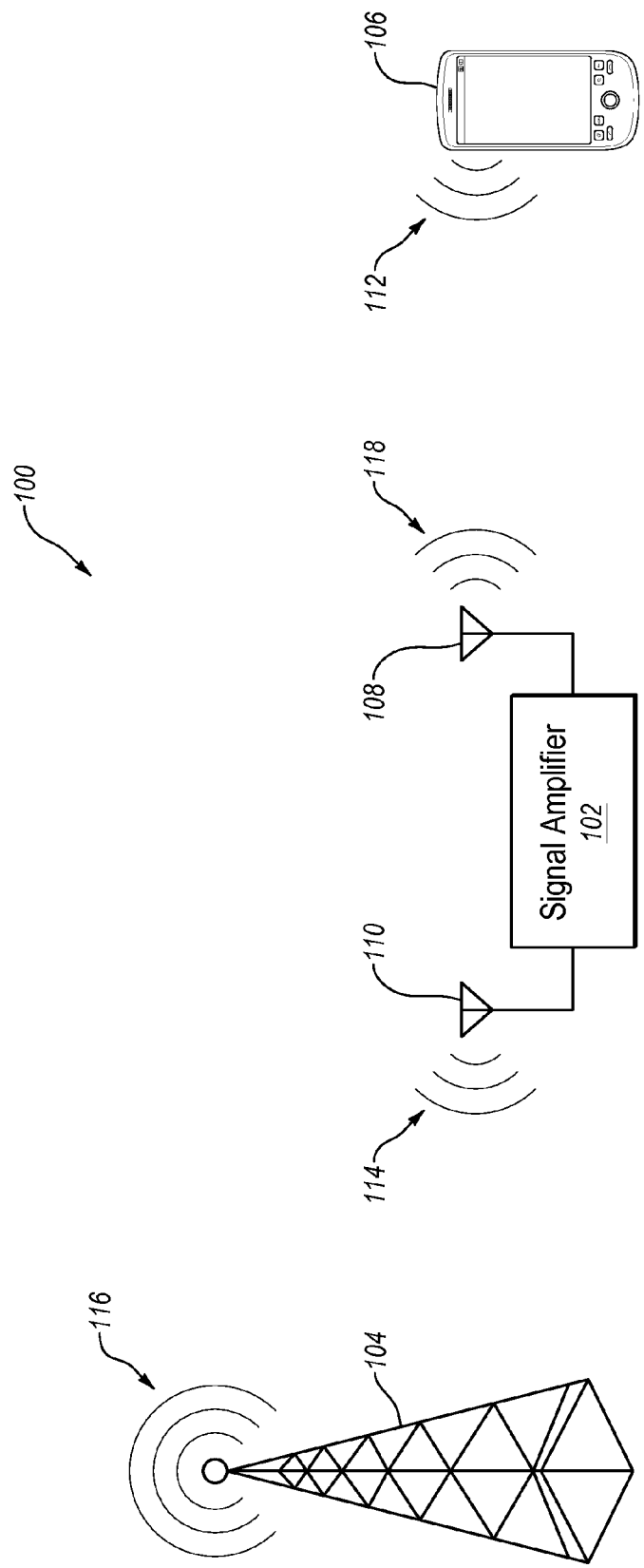
FIG. 1 illustrates an example wireless communication system.

FIG. 1 illustrates an example wireless communication system 100 (referred to hereinafter as "system 100"), arranged in accordance with at least some embodiments described herein. The system 100 may be configured to provide wireless communication services to a wireless device 106 via an access point 104. The system 100 may further include a bi-directional signal booster 102 (referred to hereinafter as "the signal booster 102"). The signal booster 102 may be any suitable system, device, or apparatus configured to receive wireless signals communicated between the access point 104 and the wireless device 106. The signal booster 102 may be configured to amplify, repeat, filter, or otherwise process the received wireless signals and may be configured to re-transmit the processed wireless signals. Although not expressly illustrated in FIG. 1, the system 100 may include any number of access points 104 providing wireless communication services to any number of wireless devices 106.

The wireless communication services provided by the system 100 may include voice services, data services, messaging services, and/or any suitable combination thereof. The system 100 may include a Frequency Division Duplexing network, a Frequency Division Multiple Access (FDMA) network, an Orthogonal FDMA (OFDMA) network, a Code Division Multiple Access (CDMA) network, a Time Division Multiple Access (TDMA) network, a Direct Sequence Spread Spectrum (DSSS) network, a Frequency Hopping Spread Spectrum (FHSS) network, a wireless local network, such as an 802.11 network, and/or some other wireless communication network. In some embodiments, the system 100 may be configured to operate as a second generation (2G) wireless communication network, a third generation (3G) wireless communication network, a fourth generation (4G) wireless communication network, and/or a Wi-Fi network. In these or other embodiments, the system 100 may be configured to operate as a Long Term Evolution (LTE) wireless communication network.

The access point 104 may be any suitable wireless network communication point and may include, by way of example but not limitation, a base station, a remote radio head (RRH), a satellite, a wireless router, or any other suitable communication point. The wireless device 106 may be any device that may use the system 100 for obtaining wireless communication services and may include, by way of example and not limitation, a cellular phone, a smartphone, a personal data assistant (PDA), a laptop computer, a personal computer, a tablet computer, a wireless communication card, or any other similar device configured to communicate within the system 100.

As signals propagate between the access point 104 and the wireless device 106, the signals may be affected during the propagation such that, in some instances, the wireless signals communicated between the access point 104 and the wireless device 106 may be substantially degraded. The signal degradation may result in the access point 104 or the wireless device 106 not receiving, detecting, or extracting information from the wireless signals. Therefore, the signal booster 102 may be configured to increase the power of and/or improve the signal quality of the wireless signals such that the communication of the wireless signals between the access point 104 and the wireless device 106 may be improved.

In some embodiments, the signal booster 102 may receive a wireless signal communicated between the access point 104 and the wireless device 106 that may be converted into an electrical signal (e.g., via an antenna). The signal booster may be configured to amplify the electrical signal and the amplified electrical signal may be converted into an amplified wireless signal that is transmitted. The signal booster 102 may amplify the electrical signal by applying a gain to the electrical signal. The gain may be a set gain or a variable gain, and may be less than, equal to, or greater than one. Therefore, in the present disclosure, the term "amplify" may refer to applying any gain to a wireless signal even if the gain is less than one.

In some embodiments, the signal booster 102 may adjust the gain based on conditions associated with communicating the wireless signals (e.g., providing noise floor, oscillation, and/or overload protection). In these and other embodiments, the signal booster 102 may adjust the gain in real time. The signal booster 102 may also filter out noise associated with the received wireless signal such that the retransmitted wireless signal may be a cleaner signal than the received wireless signal. Therefore, the signal booster 102 may improve the communication of wireless signals between the access point 104 and the wireless device 106.

For example, the wireless device 106 may communicate a wireless uplink signal 112 intended for reception by the access point 104 and a first antenna 108 may be configured to receive the wireless uplink signal. The first antenna 108 may be configured to convert the received wireless uplink signal 112 into an electrical uplink signal. Additionally, the first antenna 108 may be communicatively coupled to a first interface port (not expressly depicted in FIG. 1) of the signal booster 102 such that the signal booster 102 may receive the electrical uplink signal 112 at the first interface port. An interface port may be any suitable port configured to interface the signal booster 102 with another device (e.g., an antenna or a modem) from which the signal booster 102 may receive a signal and/or to which the signal booster 102 may communicate a signal.

In some embodiments, the signal booster 102 may be configured to apply a gain to the electrical uplink signal to amplify the electrical uplink signal. In the illustrated embodiment, the signal booster 102 may direct the amplified electrical uplink signal toward a second interface port (not expressly depicted in FIG. 1) of the signal booster 102 that may be communicatively coupled to a second antenna 110. The second antenna 110 may be configured to receive the amplified electrical uplink signal from the second interface port and may convert the amplified electrical uplink signal into an amplified wireless uplink signal 114 that may also be transmitted by the second antenna 110. The amplified wireless uplink signal 114 may be received by the access point 104.

In some embodiments, the signal booster 102 may also be configured to filter the electrical uplink signal to remove at least some noise associated with the received wireless uplink signal 112. Consequently, the amplified wireless uplink signal 114 may have a better signal to noise ratio (SNR) than the wireless uplink signal 112 that may be received by the first antenna 108. Accordingly, the signal booster 102 may be configured to improve the communication of uplink signals between the access point 104 and the wireless device 106. The use of the term "uplink signal" without specifying wireless or electrical uplink signals may refer to wireless uplink signals or electrical uplink signals.

As another example, the access point 104 may communicate a wireless downlink signal 116 intended for the wireless device 106 and the second antenna 110 may be configured to receive the wireless downlink signal 116. The second antenna 110 may convert the received wireless downlink signal 116 into an electrical downlink signal such that the electrical downlink signal may be received at the second interface port of the signal booster 102. In some embodiments, the signal booster 102 may be configured to apply a gain to the electrical downlink signal to amplify the electrical downlink signal. The signal booster 102 may also be configured to direct the amplified electrical downlink signal toward the first interface port of the signal booster 102 such that the first antenna 108 may receive the amplified electrical downlink signal. The first antenna 108 may be configured to convert the amplified electrical downlink signal into an amplified wireless downlink signal that may also be transmitted by the first antenna 108. Accordingly, the amplified downlink signal 118 may be received by the wireless device 106.

In some embodiments, the signal booster 102 may also be configured to filter the electrical downlink signal to remove at least some noise associated with the received wireless downlink signal 116. Therefore, the amplified wireless downlink signal 118 may have a better SNR than the wireless downlink signal 116 received by the second antenna 110. Accordingly, the signal booster 102 may also be configured to improve the communication of downlink signals between the access point 104 and the wireless device 106. The use of the term "downlink signal" without specifying wireless or electrical downlink signals may refer to wireless downlink signals or electrical downlink signals.

Modifications may be made to the system 100 without departing from the scope of the present disclosure. For example, in some embodiments, the distance between the signal booster 102 and the wireless device 106 may be relatively close as compared to the distance between the signal booster 102 and the access point 104. Further, the system 100 may include any number of signal boosters 102, access points 104, and/or wireless devices 106. Additionally, in some embodiments the signal booster 102 may be integrated with the wireless device 106, and in other embodiments, the signal booster 102 may be separate from the wireless device 106. Also, in some embodiments, the signal booster 102 may be included in a cradle configured to hold the wireless device 106. Additionally, in some embodiments, the signal booster 102 may be configured to communicate with the wireless device 106 via wired communications (e.g., using electrical signals communicated over a wire) instead of wireless communications (e.g., via wireless signals).

Further, in some embodiments, the signal booster 102 may be configured such that the uplink signals and downlink signals are amplified within a common amplification path. The common amplification path may include one or more common amplifiers configured such that each common amplifier may apply a gain to both the uplink and downlink signals. The common amplification path may accordingly reduce a number of components within the signal booster 102, which may reduce a cost associated with the signal booster 102.

Additionally, although the signal booster 102 is illustrated and described with respect to receiving and transmitting signals via the first antenna 108 and the second antenna 110, the scope of the present disclosure is not limited to such applications. For example, in some embodiments, the signal booster 102 (or other signal boosters described herein) may receive and/or transmit signals via one or more modems.

Figure 2:
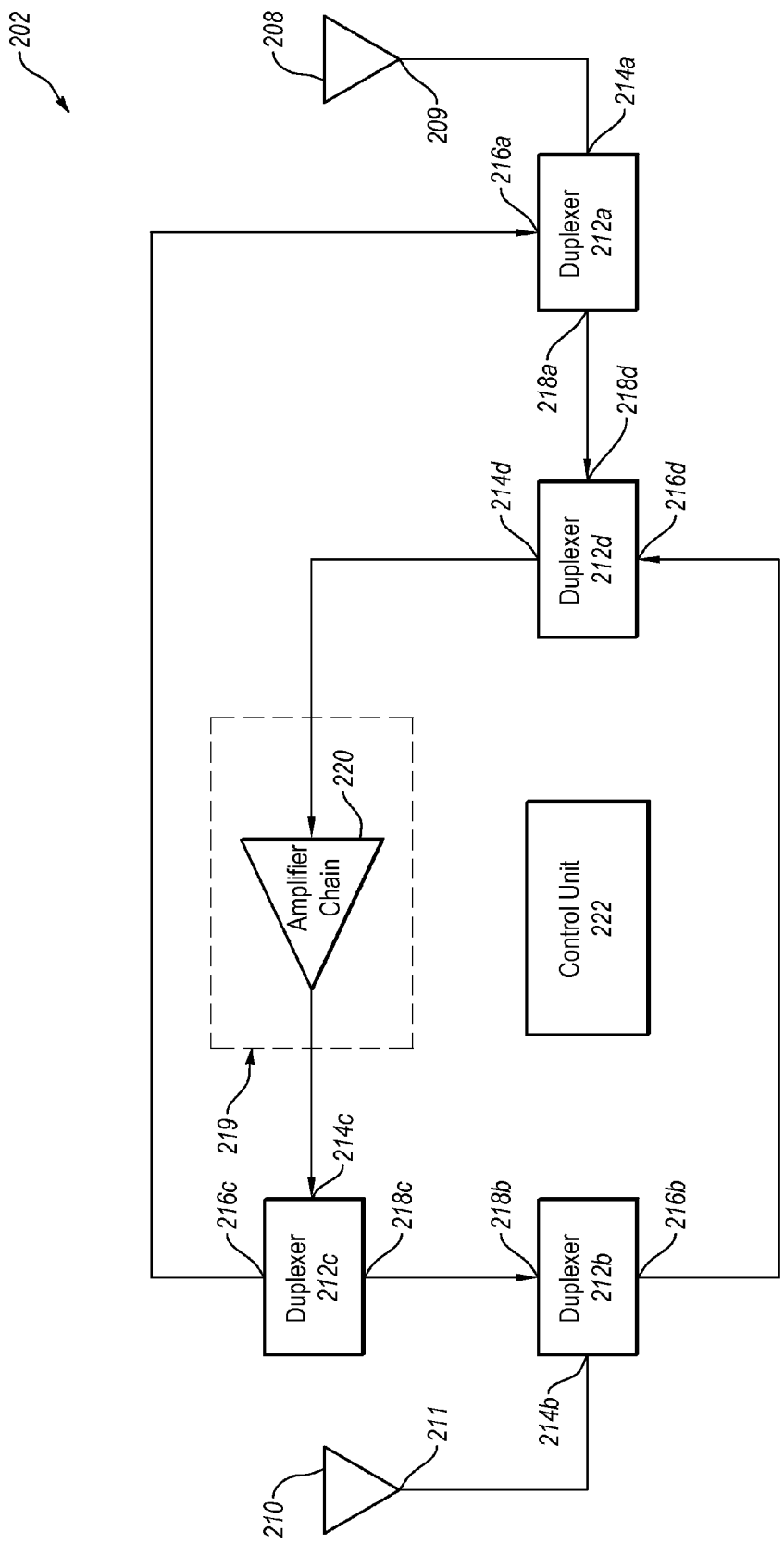
FIGS. 2-3 illustrate example embodiments of a bi-directional signal booster with a common amplification path.

FIG. 2 illustrates an example embodiment of a bi-directional signal booster 202 (referred to hereinafter as "the signal booster 202") with a common amplification path 219, arranged in accordance with at least some embodiments described herein. In some embodiments, the signal booster 202 may be configured to operate in a manner analogous to the operation of the signal booster 102 of the system 100 of FIG. 1. The signal booster 202 may include a first interface port 209 communicatively coupled to a first antenna 208, a second interface port 211 communicatively coupled to a second antenna 210, with the common amplification path 219 communicatively coupled between the first interface port 209 and the second interface port 211.

The signal booster 202 may be configured such that uplink signals that may be received at the first interface port 209 from the first antenna 208 may be directed toward the common amplification path 219. The signal booster 202 may also be configured such that the uplink signals may be directed from the common amplification path 219 toward the second interface port 211 and the second antenna 210. Additionally, the signal booster 202 may also be configured such that downlink signals that may be received at the second interface port 211 from the second antenna 210 may be directed toward the common amplification path 219. The signal booster 202 may also be configured to direct the downlink signals from the common amplification path 219 toward the first interface port 209 and the first antenna 208. Accordingly, the signal booster 202 may be configured such that the common amplification path 219 may receive and amplify both the downlink and the uplink signals.

In some embodiments, the signal booster 202 may also include duplexers 212*a*-212*d* that may be configured to direct the uplink signals from the first interface port 209 toward the common amplification path 219 and from the common amplification path 219 toward the second interface port 211. The duplexers 212*a*-212*d* may also be configured to direct the downlink signals from the second interface port 211 toward the common amplification path 219 and from the common amplification path 219 toward the first interface port 209.

The duplexer 212*a* may include a common port 214*a*, a downlink port 216*a* and an uplink port 218*a*. The duplexer 212*b* may include a common port 214*b*, a downlink port 216*b* and an uplink port 218*b*. The duplexer 212*c* may include a common port 214*c*, a downlink port 216*c* and an uplink port 218*c*, and the duplexer 212*d* may include a common port 214*d*, a downlink port 216*d* and an uplink port 218*d*. Each duplexer 212 may be configured such that downlink signals received at their respective common ports 214 are directed out of their respective downlink ports 216 and such that uplink signals received at their respective common ports 214 are directed out of their respective uplink ports 218. Additionally, each duplexer 212 may be configured such that downlink signals received at their respective downlink ports 216 may be directed out of their respective common ports 214 and such that uplink signals received at their respective uplink ports 218 may be directed out of their respective common ports 214.

In some embodiments, the duplexers 212*a*-212*d* may be configured to direct the uplink and downlink signals using filters configured based on frequency ranges associated with the uplink and downlink signals. For example, a particular duplexer 212 may include an uplink filter communicatively coupled between its common port 214 and its uplink port 218. The uplink filter may be configured to filter signals based on uplink signal frequencies such that frequencies within the uplink signal frequencies may pass through the uplink filter and frequencies outside of the uplink signal frequencies may be filtered out by the uplink filter. The particular duplexer 212 may also include a downlink filter communicatively coupled between its common port 214 and its downlink port 216. Each downlink filter may be configured to filter signals based on downlink signal frequencies such that frequencies within the downlink signal frequencies may pass through the downlink filter and frequencies outside of the downlink signal frequencies may be filtered out by the downlink filter.

Therefore, in some embodiments, one or more of the duplexers 212*a*-212*d* may be replaced with a set of filters (e.g., band pass filters), where one of the filters may be configured based on uplink signal frequencies and the other filter may be configured based on downlink signal frequencies. Further, in some embodiments, a signal splitter/combiner that may not provide filtering may be used as one or more of the duplexers 212*a*-212*d*. Additionally, in some embodiments, a component that may direct signals in a certain direction (e.g., a circulator) may be used as the duplexer 212*a* and/or the duplexer 212*b*.

With respect to uplink signals, in the illustrated embodiment, the common port 214*a* of the duplexer 212*a* may be communicatively coupled to the first interface port 209 such that the common port 214*a* may receive uplink signals that may be received by the first interface port 209 via the first antenna 208. The duplexer 212*a* may direct the uplink signals received at the common port 214*a* to be output at the uplink port 218*a* of the duplexer 212*a*, which may be communicatively coupled to the uplink port 218*d* of the duplexer 212*d*. The duplexer 212*d* may be configured to direct the uplink signals received at the uplink port 218*d* to be output at the common port 214*d*. The common port 214*d* may be communicatively coupled to the common amplification path 219 such that the duplexer 212*d* may direct the uplink signals toward the common amplification path 219. Therefore, the duplexer 212*a* and the duplexer 212*d* may be configured to direct the uplink signals from the first interface port 209 toward the common amplification path 219.

With respect to downlink signals, in the illustrated embodiment, the common port 214*b* of the duplexer 212*b* may be communicatively coupled to the second interface port 211 such that the common port 214*b* may receive downlink signals that may be received by the second interface port 211 via the second antenna 210. The duplexer 212*b* may direct the downlink signals received at the common port 214*b* to be output at the downlink port 216*b* of the duplexer 212*b*, which may be communicatively coupled to the downlink port 216*d* of the duplexer 212*d*. The duplexer 212*d* may be configured to direct the downlink signals received at the downlink port 216*d* to be output at the common port 214*d*. As mentioned above, the common port 214*d* may be communicatively coupled to the common amplification path 219 such that the duplexer 212d may direct the downlink signals toward the common amplification path 219. Therefore, the duplexer 212b and the duplexer 212d may be configured to direct the downlink signals from the second interface port 211 toward the common amplification path 219.

The common amplification path 219 may include one or more common amplifier chains, such as a common amplifier chain 220. The common amplifier chain 220 may include one or more common amplifiers configured to apply a gain to signals received by the common amplifier chain 220. In the illustrated embodiment, the common amplifier chain 220 may be communicatively coupled to the common port 214d of the duplexer 212d. Therefore, the common amplifier chain 220 may be configured to receive both uplink and downlink signals such that the common amplifier chain 220 may apply a gain to both the downlink signals and the uplink signals that may be output by the duplexer 212d. As mentioned above, the gain may be a set gain or a variable gain and may be less than, equal to, or greater than one. In some embodiments the gain of the common amplifier chain 220 may be adjusted by a control unit 222 communicatively coupled to the common amplifier chain 220. In some embodiments the control unit 222 may adjust the gain of the common amplifier chain 220 based on wireless communication conditions.

If included in the signal booster 202, the control unit 222 may be implemented by any suitable mechanism, such as a program, software, function, library, software as a service, analog or digital circuitry, or any combination thereof. The control unit 222 may also include a processor coupled to memory. The processor may include, for example, a microprocessor, microcontroller, digital signal processor (DSP), application specific integrated circuit (ASIC), a Field Programmable Gate Array (FPGA), or any other digital or analog circuitry configured to interpret and/or to execute program instructions and/or to process data. In some embodiments, the processor may interpret and/or execute program instructions and/or process data stored in the memory. The instructions may include instructions for adjusting the gain of the common amplifier chain 220. For example, the adjustments may be based on radio frequency (RF) signal inputs.

The memory may include any suitable computer readable media configured to retain program instructions and/or data for a period of time. By way of example, and not limitation, such computer readable media may include tangible computer readable storage media including random access memory (RAM), read only memory (ROM), electrically erasable programmable read only memory (EEPROM), a compact disk (CD) ROM or other optical disk storage, magnetic disk storage or other magnetic storage devices, flash memory devices (e.g., solid state memory devices) or any other storage medium which may be used to carry or store desired program code in the form of computer executable instructions or data structures and which may be accessed by a general purpose or special purpose computer. Combinations of the above may also be included within the scope of computer readable media. Computer executable instructions may include, for example, instructions and data that cause a general purpose computer, special purpose computer, or special purpose processing device to perform a certain function or group of functions.

The common amplifier chain 220 may be communicatively coupled to the common port 214c of the duplexer 212c such that the common port 214c may receive both the uplink signals and the downlink signals output by the common amplifier chain 220. The duplexer 212c may be configured to direct the downlink signals from the common port 214c toward the downlink port 216c and direct the uplink signals from the common port 214c toward the uplink port 218c. The downlink port 216c of the duplexer 212c may be communicatively coupled to the downlink port 216a of the duplexer 212a such that the duplexer 212c may be configured to direct the downlink signals toward the downlink port 216a of the duplexer 212a. Similarly, the uplink port 218c of the duplexer 212c may be communicatively coupled to the uplink port 218b of the duplexer 212b such that the duplexer 212c may be configured to direct the uplink signals toward the uplink port 218b of the duplexer 212b.

The duplexer 212a may direct the downlink signals from the downlink port 216a toward the common port 214a such that the downlink signals may be communicated from the common port 214a toward the first antenna 208 via the first interface port 209. The duplexer 212b may direct the uplink signals from the uplink port 218b toward the common port 214b such that the uplink signals may be communicated from the common port 214b toward the second antenna 210 via the second interface port 211.

Therefore, the duplexers 212a-212d of the signal booster 202 may be configured to direct uplink signals received at the first interface port 209 toward the common amplification path 219 and from the common amplification path 219 toward the second interface port 211. Additionally, the duplexers 212a-212d may be configured to direct downlink signals received at the second interface port 211 toward the common amplification path 219 and from the common amplification path 219 toward the first interface port 209. Therefore the signal booster 202 may be configured such that both downlink signals and uplink signals may pass through and be amplified by one or more common amplifier chains 220 of the common amplification path 219, which may reduce the number of components within the signal booster 202.

Modifications, additions, or omissions may be made to the signal booster 202 without departing from the scope of the present disclosure. For example, one or more amplifier chains may be included between the duplexers 212a and 212d and/or the duplexers 212b and 212d such that the uplink and/or downlink signals may be individually amplified before reaching the common amplification path 219. Further, in these or other embodiments, one or more amplifier chains may be included between the duplexers 212c and 212a and/or between the duplexers 212c and 212b such that the downlink and uplink signals may be individually amplified after leaving the common application path 219 but before being transmitted by the second antenna 210 and the first antenna 208, respectively. Therefore, in some embodiments, the signal booster 202 may be configured such that the gain applied to the uplink and downlink signals may be different.

Additionally, in some embodiments, the signal booster 202 may include more than one common amplification path where each common amplification path may be configured to apply a gain to uplink and downlink signals associated with a particular wireless communication band. For example, the signal booster 202 may include a common amplification path for each of one or more bands of a 700 Megahertz (MHz) band plan for commercial services of the Third Generation Partnership Project (3 GPP) (the "700 MHz band plan").

Figure 3:
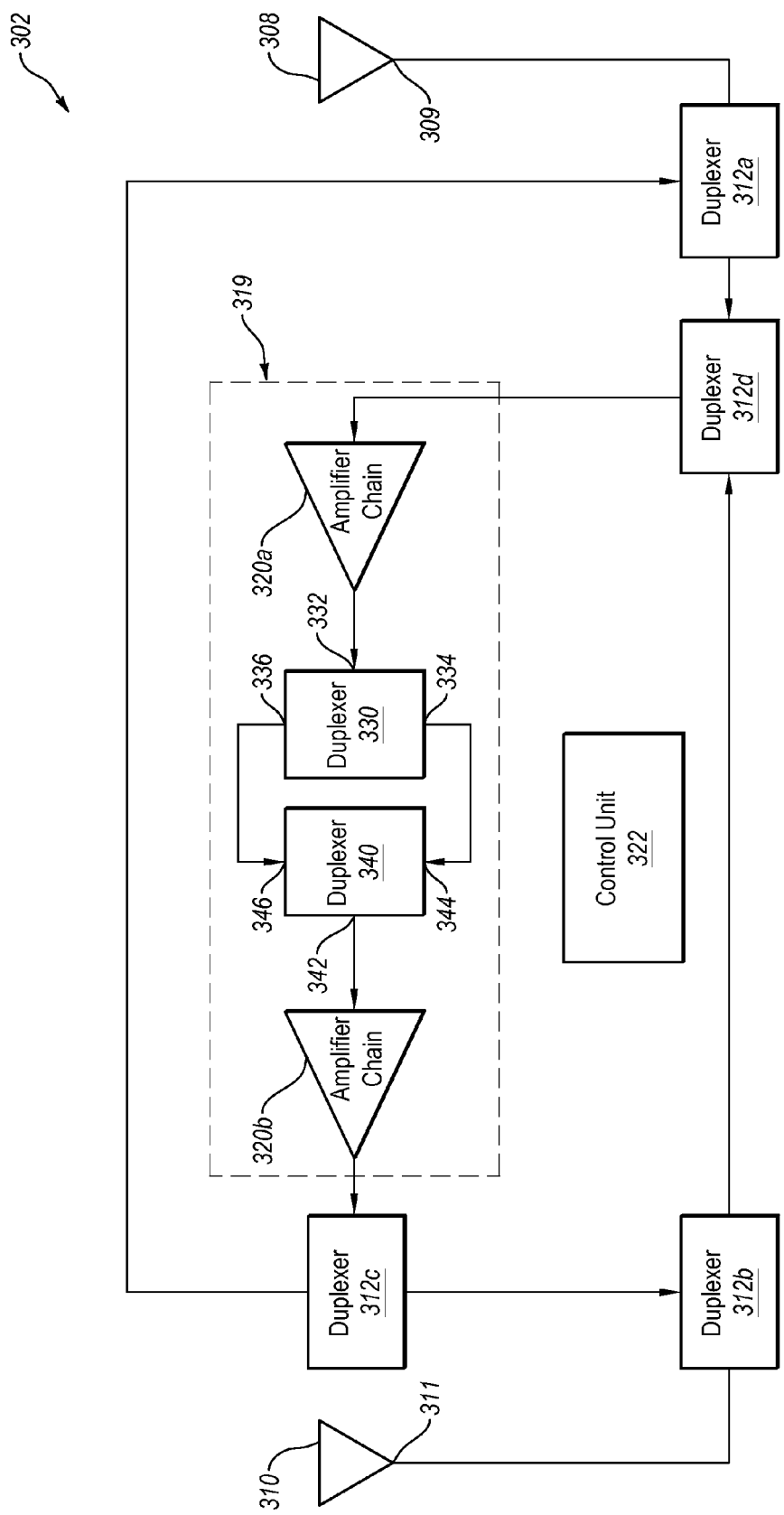

Also, in some embodiments, the common amplification path 219 may include additional amplifier chains than that expressly depicted and/or may include one or more filtering schemes configured to filter the uplink and/or downlink signals. The filtering may be performed to reduce noise in the uplink and downlink signals and/or to provide improved isolation between the uplink and downlink signals. FIG. 3 below depicts an example embodiment of a signal booster with a common amplification path configured to filter the downlink and uplink signals.

Figure 4:
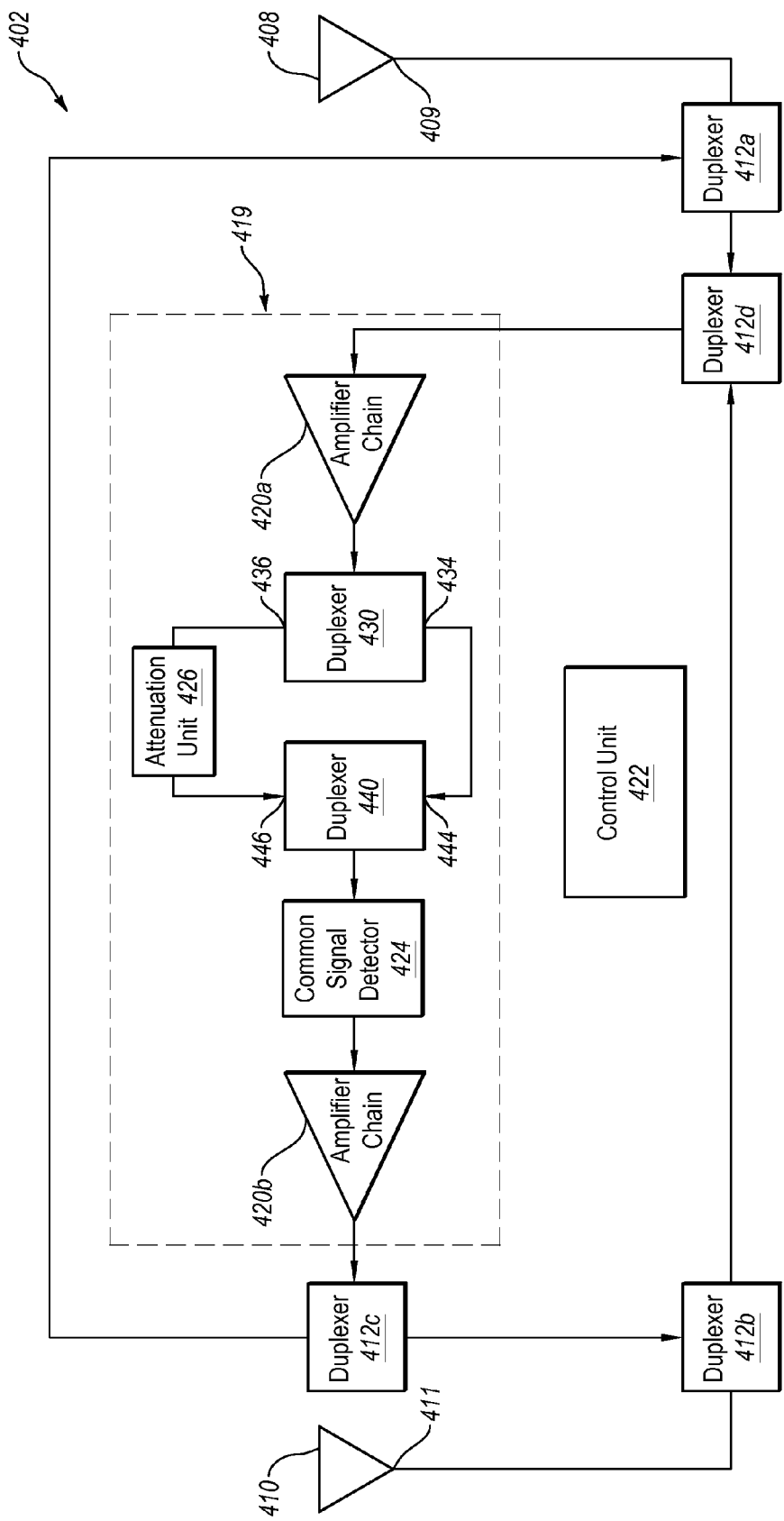
FIG. 4 illustrates an example embodiment of a bi-directional signal booster with a common amplification path and a common signal detector.

Further, the common amplification path 219 may include other components than those expressly depicted, such as one or more attenuators (variable and/or set) that may be configured to attenuate the downlink and/or uplink signals by applying a gain of less than one to the uplink and downlink signals. In some embodiments, the additional components may be included between the components expressly depicted in the figures. As such, the use of the terms "from," "to," and "toward" with respect to signals propagating between specific components may include embodiments where intermediate components may be between the specific components. Further, in these and other embodiments, the common amplification path 219 may include a common signal detector (e.g., a radio frequency (RF) sensor) configured to receive both the uplink and downlink signals and configured such that it may detect a power level of both the uplink and downlink signals. FIG. 4 depicts an example embodiment where a common signal detector may be used to detect the power levels of both the uplink and downlink signals.

Additionally, although the above embodiment is described with respect to a signal booster, the above described configuration of directing opposite direction signals (e.g., uplink and downlink signals) to and from a common amplification path may be used with respect to any suitable bi-directional amplifier. Accordingly, the scope of the present disclosure is not limited to signal boosters.

FIG. 3 illustrates an example embodiment of a bi-directional signal booster 302 102 (referred to hereinafter as "the signal booster 302") with a common amplification path 319, arranged in accordance with at least some embodiments described herein. In some embodiments, the signal booster 302 may be configured to operate in a manner analogous to the operation of the signal booster 102 of the system 100 of FIG. 1. The signal booster 302 may include a first interface port 309 communicatively coupled to a first antenna 308, a second interface port 311 communicatively coupled to a second antenna 310, with the common amplification path 319 communicatively coupled between the first interface port 309 and the second interface port 311.

Similar to the signal booster 202 of FIG. 2, the signal booster 302 may be configured such that uplink signals received at the first interface port 309 from the first antenna 308 may be directed toward the common amplification path 319. The signal booster 302 may be configured such that downlink signals received at the second interface port 311 from the second antenna 310 may also be directed toward the common amplification path 319. The common amplification path 319 may accordingly be configured to amplify both the uplink and downlink signals.

The signal booster 302 may additionally be configured to direct the uplink signals from the common amplification path 319 toward the second interface port 311 and the second antenna 310. The signal booster 302 may also be configured to direct the downlink signals from the common amplification path 319 toward the first interface port 309 and the first antenna 308. In the illustrated embodiment of FIG. 3, the signal booster 302 may include duplexers 312a-312d configured in a manner analogous to that of the duplexers 212a-212d of the signal booster 202 of FIG. 2. The duplexers 312a-312d may accordingly be configured to direct the uplink and downlink signals in a manner analogous to how the duplexers 212a-212d direct uplink and downlink signals in the signal booster 202 of FIG. 2.

In the illustrated embodiment, the common amplification path 319 may include a common amplifier chain 320a and a common amplifier chain 320b. The common amplifier chains 320a and 320b may each be configured to apply a gain to the uplink and downlink signals that may propagate through the common amplification path 319, similar to the common amplifier chain 220 of FIG. 2. In some embodiments the common amplifier chain 320a and/or the common amplifier chain 320b may be configured to apply the gain based on instructions received from a control unit 322 of the signal booster 302 that may be analogous to the control unit 222 of the signal booster 202 of FIG. 2.

In some embodiments, the common amplification path 319 may include a splitting duplexer 330 and a combining duplexer 340 that may be configured to filter the uplink and downlink signals that may propagate through the common amplification path 319. As described in further detail below, the splitting duplexer 330 may be configured to separate (i.e., split) the uplink signals within the common amplification path 319 from the downlink signals within the common amplification path. Additionally, as described in further detail below, the combining duplexer 340 may be configured to recombine the uplink and downlink signals after they have been separated by the splitting duplexer 330.

In the illustrated embodiment, the splitting duplexer 330 may include a common port 332 communicatively coupled to an output of the common amplifier chain 320a such that the common port 332 may receive the uplink and downlink signals that have been amplified by the common amplifier chain 320a. In some embodiments, the splitting duplexer 330 may be configured to filter uplink signals received at the common port 332 based on an uplink frequency range associated with the uplink signals such that the uplink signals and their associated uplink frequencies may pass through the filtering and may be output at an uplink port 336 of the splitting duplexer 330. Additionally, frequencies outside of the uplink frequency range (e.g., noise, downlink frequencies, etc.) may be filtered out and may not be output at the uplink port 336. The splitting duplexer 330 may also be configured to filter downlink signals received at the common port 332 based on a downlink frequency range associated with the downlink signals such that the downlink signals and their associated downlink frequencies may pass through the filtering and may be output at a downlink port 334 of the splitting duplexer 330. Additionally, frequencies outside of the downlink frequency range (e.g., noise, uplink frequencies, etc.) may be filtered out and not output at the downlink port 334.

The downlink port 334 of the splitting duplexer 330 may be communicatively coupled to a downlink port 344 of the combining duplexer 340 and the uplink port 336 of the splitting duplexer 330 may be communicatively coupled to an uplink port 346 of the combining duplexer 340. In some embodiments, the combining duplexer 340 may be configured to filter the uplink signals received at the uplink port 346 based on the frequency range associated with the uplink signals in a manner similar to the splitting duplexer 330. In some embodiments, the combining duplexer 340 may also be configured to filter the downlink signals received at the downlink port 344 based on the frequency range associated with the downlink signals in a manner similar to the splitting duplexer 330. The combining duplexer 340 may also be configured to output the filtered uplink and downlink signals at the common port 342 of the combining duplexer 340. In the illustrated embodiment, the common port 342 of the combining duplexer 340 may be communicatively coupled to the common amplifier chain 320b such that the common amplifier chain 320b may receive both the uplink and downlink signals output at the common port 342 and may apply a gain to both the uplink and downlink signals.

In some embodiments, the common amplification path 319 may include a downlink gain block (not expressly depicted in FIG. 3) communicatively coupled between the downlink ports 334 and 344 of the duplexers 330 and 340, respectively. The downlink gain block may accordingly be configured to receive and apply and/or adjust a gain to the downlink signals but not the uplink signals. In some embodiments, the downlink gain block may be configured to apply and/or adjust the gain in response to instructions received from the control unit 322. The downlink gain block may be any suitable system, apparatus, or device configured to apply a gain to the downlink signals received by the downlink gain block. For example, the downlink gain block may include an amplifier chain and/or an attenuator.

In these or other embodiments, the common amplification path 319 may include an uplink gain block (not expressly depicted in FIG. 3) communicatively coupled between the uplink ports 336 and 346 of the duplexers 330 and 340. The uplink gain block may be configured to receive and apply and/or adjust a gain to the uplink signals but not the downlink signals. In some embodiments, the uplink gain block may be configured to apply the gain in response to instructions received from the control unit 322. The uplink gain block may be any suitable system, apparatus, or device configured to apply a gain to the uplink signals received by the uplink gain block. For example, the uplink gain block may include an amplifier chain and/or an attenuator.

Therefore, the common amplification path 319 may also be configured to filter the uplink and downlink signals that may propagate through the common amplification path 319. The filtering may improve signal quality, increase isolation between the uplink and downlink signals, and/or allow for greater amplification of the downlink and/or uplink signals. Additionally, through the placement of one or more uplink gain blocks and/or one or more downlink gain blocks, the common amplification path 319 may be configured to apply different gains to the uplink and downlink signals.

Modifications, additions, or omissions may be made to the signal booster 302 without departing from the scope of the present disclosure. For example, the location of the splitting duplexer 330 and the combining duplexer 340 within the common amplification path 319 with respect to the common amplifier chains 320a and 320b, as well as with respect to other amplifier chains not expressly depicted, may vary without departing from the scope of the present disclosure.

Also, in some embodiments, the splitting duplexer 330 or the combining duplexer 340 may be replaced with a signal splitter/combiner that may not perform any filtering as described, but may instead split or combine the uplink and downlink signals in the manner described. For example, in some embodiments, the splitting duplexer 330 may be replaced with a signal splitter that may not perform any filtering and that may direct both downlink and uplink signals toward the uplink port 346 and the downlink port 344 of the combining duplexer 340. The combining duplexer may accordingly filter out the downlink signals received at the uplink port 346 and filter out the uplink signals received at the downlink port 344, such that filtered downlink and uplink signals are output at the common port 342. In other embodiments, the combining duplexer 340 may be replaced with a signal splitter/combiner configured to receive the uplink and downlink signals from the splitting duplexer 330 and may output the uplink and downlink signals at the common port 342 without providing additional filtering.

Additionally, in some embodiments, one or more of the duplexers 312a-312d may be replaced with a signal splitter/combiner. Further, as mentioned above, in some embodiments, one or more the duplexers of FIG. 3 may be replaced with a set of filters (e.g., band pass filters), where for each replaced duplexer one of the filters may be configured based on uplink signal frequencies in the other filter may be configured based on downlink signal frequencies.

Moreover, one or more amplifier chains may be included between the duplexers 312a and 312d and/or the duplexers 312b and 312d such that the uplink and/or downlink signals may be individually amplified before reaching the common amplification path 319. Further, in these or other embodiments, one or more amplifier chains may be included between the duplexers 312c and 312a and/or between the duplexers 312c and 312b such that the downlink and uplink signals may be individually amplified after leaving the common application path 319 but before being transmitted by the second antenna 310 and the first antenna 308, respectively. Therefore, the signal booster 302 may be configured such that the gain of the uplink and downlink signals may be adjusted individually.

Further, in some embodiments, the signal booster 302 may include more than one common amplification path where each common amplification path may be configured to apply a gain to uplink and downlink signals associated with a particular wireless communication band, such as a band of the 700 MHz band plan. Also, in some embodiments, the common amplification path 319 may include additional amplifier chains than those expressly depicted.

FIG. 4 illustrates an example embodiment of a bi-directional signal booster 402 (referred to hereinafter as "the signal booster 402") with a common amplification path 419, arranged in accordance with the least some embodiments described herein. In some embodiments, the signal booster 402 may be configured to operate in a manner analogous to the operation of a signal booster 102 of the system 100 of FIG. 1. Similar to the signal booster 202 of FIG. 2, the signal booster 402 may include a first interface port 409 communicatively coupled to a first antenna 408, a second interface port 411 communicatively coupled to a second antenna 410, with the common amplification path 419 communicatively coupled between the first interface port 409 and the second interface port 411.

Analogous to the signal booster 202 of FIG. 2, the signal booster 402 may be configured such that uplink signals received at the first interface port 409 from the first antenna 408 may be directed toward the common amplification path 419. The signal booster 402 may additionally be configured such that downlink signals received at the second interface port 411 from the second antenna 410 may also be directed toward the common amplification path 419. The common amplification path 419 may accordingly be configured to receive and amplify both the uplink and downlink signals.

The signal booster 402 may be configured to direct the uplink signals from the common amplification path 419 toward the second interface port 411 and the second antenna 410. The signal booster 402 may also be configured to direct the downlink signals from the common amplification path 419 toward the first interface port 409 and the first antenna 408. In the illustrated embodiment of FIG. 4, the signal booster 402 may include duplexers 412a-412d configured in a manner analogous to that of the duplexers 212a-212d of the signal booster 202 of FIG. 2. The duplexers 412a-412d may accordingly be configured to direct the uplink and downlink signals in a manner analogous to how the duplexers 212a-212d direct uplink and downlink signals in the signal booster 202 of FIG. 2.

In the illustrated embodiment, the common amplification path 419 may include a common amplifier chain 420a and a common amplifier chain 420b that may be analogous to the common amplifier chains 320a and 320b, respectively, of FIG. 3. Therefore, the common amplifier chains 420a and 420b may be configured to amplify and filter the uplink and downlink signals that may propagate through the common amplification path 419 in a manner analogous to that of the common amplifier chains 320a and 320b of the common amplification path 310 of FIG. 3. In some embodiments the common amplifier chains 420a and 420b may be configured to amplify the uplink and downlink signals based on instructions received from a control unit 422 of the signal booster 402 that may be analogous to the control unit 222 of the signal booster 202 of FIG. 2. Additionally, the common amplification path 419 may include a splitting duplexer 430 and a combining duplexer 440 that may be analogous to splitting duplexer 330 and the combining duplexer 340, respectively, of the common amplification path 319 of FIG. 3.

In some embodiments, the common amplification path 419 may include a common signal detector 424 configured to receive both the uplink and downlink signals that may propagate through the common amplification path 419. The common signal detector 424 may be any suitable system, apparatus, or device configured to detect a power level of signals that it may receive. For example, in some embodiments, the common signal detector 424 may be an RF sensor that may include a signal rectifier (e.g., a diode) and a resistor that may have a variable output voltage based on the power of received signals. As such, the common signal detector 424 may be configured to detect power levels of both the uplink and downlink signals that may propagate through the common amplification path 419. In traditional embodiments, a signal booster may include an uplink signal detector configured to detect the power level of uplink signals and a downlink signal detector configured to detect the power level of downlink signals, but not a signal detector configured to detect the power level of both downlink and uplink signals. Therefore, including the common signal detector 424 in the common amplification path 419 may reduce the number of components that may be used in the signal booster 402.

In some embodiments, the common signal detector 424 may be communicatively coupled to the control unit 422 such that the control unit 422 may determine the power levels of the uplink and downlink signals that may be detected by the common signal detector 424. In the illustrated embodiment, the control unit 422 may be configured to differentiate between the uplink and downlink signals using an attenuation unit 426 that may also be communicatively coupled to the control unit 422 and communicatively coupled between an uplink port 436 of the splitting duplexer 430 and an uplink port 446 of the combining duplexer 440.

In the illustrated embodiment, the signal booster 402 may be configured for instances when the uplink signals received by the signal booster 402 may have a power level that is substantially larger than the power level of the downlink signals received by the signal booster 402 (e.g., when the signal booster 402 is significantly closer to a wireless device than a wireless communication access point). Therefore, to determine a power level of the downlink signals, the control unit 422 may direct the attenuation unit 426 to attenuate the uplink signals that may pass through the attenuation unit 426 such that the downlink signals received by the common signal detector 424 may be substantially stronger than the uplink signals received by the common signal detector 424. As such, the control unit 422 may determine that the power detected by the common signal detector 424 may be associated with the downlink signals when the uplink signal is being attenuated by the attenuating unit 426.

To determine a power level of the uplink signals, the control unit 422 may direct the attenuation unit 426 to cease or substantially reduce the attenuation of the uplink signals. In the illustrated embodiment, because the received uplink signals may be much stronger than the downlink signals, the downlink power levels that may be included in the power detected by the common signal detector 424 may be substantially negligible compared to the uplink power levels when the attenuation of the uplink signals is ceased or substantially reduced. Therefore, the control unit 422 may be configured to determine that the power levels detected by the signal detector 424 may be substantially associated with the uplink signals when the attenuation of the uplink signals is ceased or substantially reduced.

The attenuation unit 426 may be any suitable system, apparatus, or device that may be configured to attenuate the uplink signals that may be received by the common signal detector 424. For example, in some embodiments the attenuation unit 426 may be a variable attenuator that may attenuate uplink signals that may pass through the attenuation unit 426 in response to instructions received from the control unit 422. In some embodiments, the attenuation unit 426 may be a switch that may be opened and closed in response to instructions received from the control unit 422. Therefore, when the switch is opened, the uplink signals may not pass to the combining duplexer 446 such that uplink signals may not be received by the common signal detector 424 and may accordingly be attenuated to a power level of substantially zero at the common signal detector 424. Additionally, in other embodiments, the attenuation unit 426 may be an amplifier chain configured to apply a gain of less than one to the uplink signals when instructed to attenuate the uplink signals.

Therefore, the signal booster 402 may be configured such that uplink and downlink signals may pass through the same amplification path (e.g., the common amplification path 419) and also such that the uplink and downlink signals may be detected using the same signal detector (e.g., the common signal detector 424). Further, the signal booster 402 may be configured such that the uplink and downlink signals may be filtered in the common amplification path 419.

Modifications, additions, or omissions may be made to the signal booster 402 without departing from the scope of the present disclosure. For example, in embodiments where the downlink signals received by the signal booster 402 may be much stronger than the uplink signals received by the signal booster 402, the attenuation unit 426 may be communicatively coupled between a downlink port 434 of the splitting duplexer 430 and a downlink port 444 of the combining duplexer 440 instead of between the uplink port 436 of the splitting duplexer 430 and the uplink port 446 of the combining duplexer 446. Moreover, in these and other embodiments, the control unit 422 may be configured to direct the attenuation of the downlink signals instead of the uplink signals.

Further, in some embodiments an uplink attenuation unit may be communicatively coupled between the duplexer 412a and the duplexer 412d in addition to or instead of having the attenuation unit 426 communicatively coupled between the uplink ports 436 and 446 of the splitting duplexer 430 and the combining duplexer 440, respectively. In applicable embodiments, a downlink attenuation unit may be communicatively coupled between the duplexer 412b and the duplexer 412d.

Additionally, in some embodiments, the common amplification path 419 may include a downlink gain block communicatively coupled between the downlink ports 434 and 444 of the duplexers 430 and 440, respectively. The downlink gain block may accordingly be configured to receive and apply and/or adjust a gain to the downlink signals but not the uplink signals. In some embodiments, the downlink gain block may be configured to apply and/or adjust the gain in response to instructions received from the control unit 422. The downlink gain block may be any suitable system, apparatus, or device configured to apply a gain to the downlink signals received by the downlink gain block. For example, the downlink gain block may include an amplifier chain and/or an attenuator.

In these or other embodiments, the common amplification path 419 may include an uplink gain block communicatively coupled between the uplink ports 436 and 446 of the duplexers 430 and 440, respectively. The uplink gain block may be configured to receive and apply and/or adjust a gain to the uplink signals but not the downlink signals. In some embodiments, the uplink gain block may be configured to apply the gain in response to instructions received from the control unit 422. The uplink gain block may be any suitable system, apparatus, or device configured to apply a gain to the uplink signals received by the uplink gain block. For example, the uplink gain block may include an amplifier chain and/or an attenuator.

Additionally, in some embodiments, an uplink attenuation unit may be communicatively coupled between the uplink ports of the splitting and combining duplexers and a downlink attenuation unit may also be communicatively coupled between the downlink ports of the splitting and combining duplexers. In these embodiments, the control unit 422 may direct the uplink attenuating unit to attenuate the uplink signals to measure the power of the downlink signals and vice versa. Additionally, the location of the common signal detector 424 with respect to other components of the common amplification path 419 may vary depending on particular embodiments.

Further, in some embodiments, the common signal detector 424 and the attenuation unit 426 may be communicatively coupled between the duplexer 412a and the first interface port 409 instead of being included in the common amplification path 419. In other embodiments, the common signal detector 424 and the attenuation unit 426 may be communicatively coupled between the duplexer 412b and the second interface port 411 instead of being included in the common amplification path 419. An example of one of these embodiments is described below with respect to FIG. 5. Accordingly, using the same signal detector to detect uplink and downlink signals is not limited to embodiments of signal boosters that may include a common amplification path, as also described below in FIG. 5.

Figure 5:
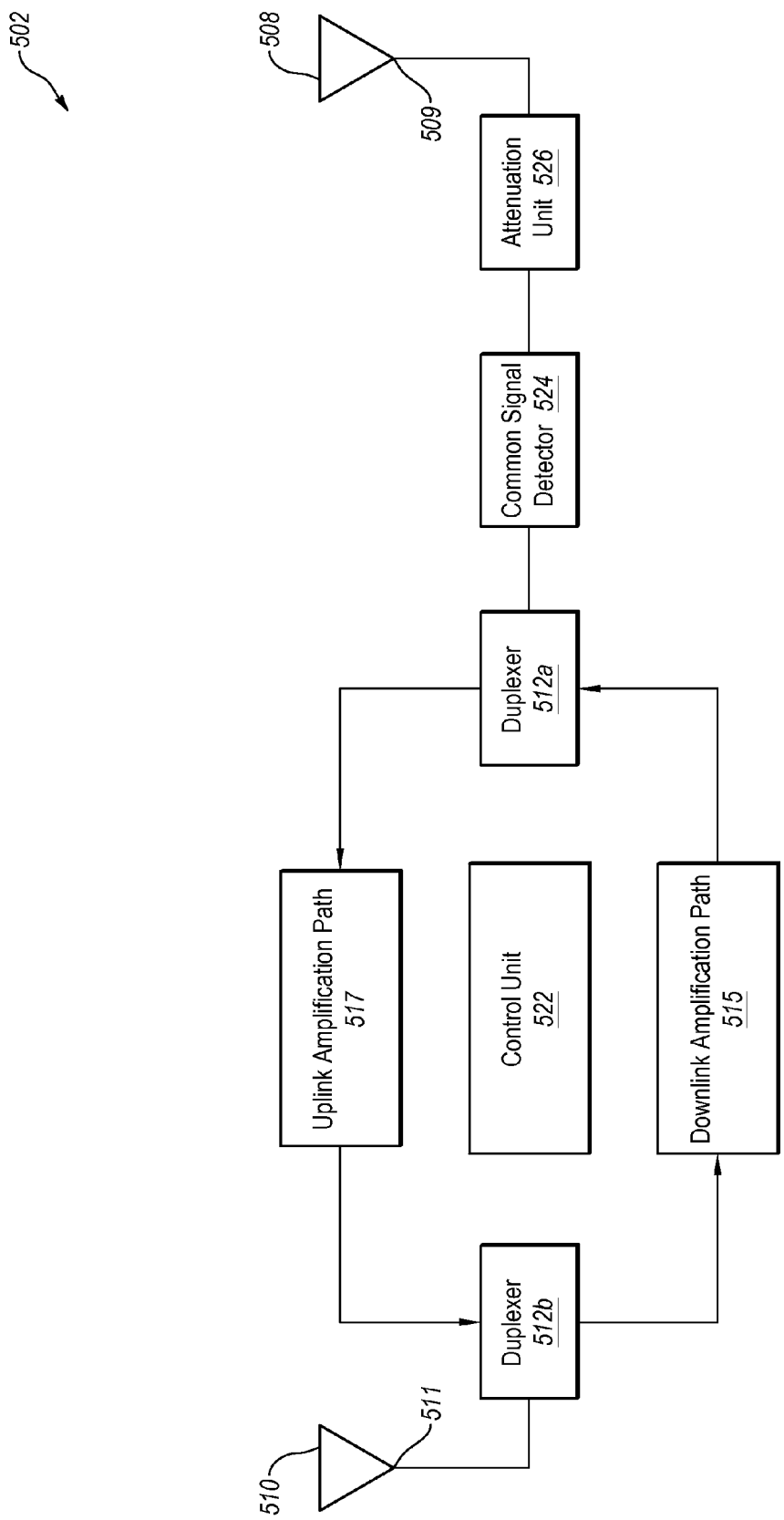
FIGS. 5-6 illustrate example embodiments of a bi-directional signal booster with a common signal detector.

FIG. 5 illustrates an example embodiment of a bi-directional signal booster 502 (referred to hereinafter as "the signal booster 502") with a common signal detector 524, arranged in accordance with the least some embodiments described herein. In some embodiments, the signal booster 502 may be configured to operate in a manner analogous to the operation of the signal booster 102 of the system 100 of FIG. 1. The signal booster 502 may include a first interface port 509 communicatively coupled to a first antenna 508, a second interface port 511 communicatively coupled to a second antenna 510, and a downlink amplification path 515 and an uplink amplification path 517, each communicatively coupled between the first interface port 509 and the second interface port 511.

The signal booster 502 may also include duplexers 512a and 512b. The duplexer 512a may be any suitable system, apparatus, or device configured to direct uplink signals that may be received at the first interface port 509 toward the uplink amplification path 517. The duplexer 512a may also be configured to receive downlink signals that may exit the downlink amplification path 515 and direct the downlink signals toward the first interface port 509 and the first antenna 508. The duplexer 512b may be any suitable system, apparatus, or device configured to direct downlink signals that may be received at the second interface port 511 toward the downlink amplification path 515. The duplexer 512b may also be configured to receive uplink signals that may exit the uplink amplification path 517 and direct the uplink signals toward the second interface port 511 and the second antenna 510. Accordingly, in the illustrated embodiment of FIG. 5, the uplink and downlink signals may be directed to separate amplification paths, instead of a common amplification path.

In the illustrated embodiment, the signal booster 502 may also include a control unit 522, the common signal detector 524 and an attenuation unit 526. The control unit 522, the common signal detector 524, and the attenuation unit 526 may be analogous to the control unit 422, the common signal detector 424, and the attenuation unit 426, respectively, of the signal booster 402 of FIG. 4. The common signal detector 524 may be communicatively coupled between the duplexer 512a and the attenuation unit 526 such that the common signal detector 524 may receive downlink signals that may be output by the duplexer 512a and uplink signals that may be output by the attenuation unit 526.

In the illustrated embodiment, and similar to that of FIG. 4, the signal booster 502 may be configured for instances when uplink signals received by the signal booster 502 may be much stronger than the downlink signals. Therefore, when the control unit 522 determines a power level of the downlink signals, the control unit 522 may direct the attenuation unit 526 to attenuate the uplink signals that may be received at the first interface port 509 and that may pass through the attenuation unit 526 to the common signal detector 524. Therefore, downlink signals communicated to the common signal detector 524 from the duplexer 512a may be substantially stronger than the uplink signals communicated to the common signal detector 524 from the attenuation unit 526. As such, the control unit 522 may determine that the power detected by the common signal detector 524 may be associated with the downlink signals when the uplink signals are being attenuated.

Additionally, similar to as described with respect to the signal booster 402 of FIG. 4, when the control unit 522 determines a power level of the uplink signals, the control unit 522 may direct the attenuation unit 526 to cease the attenuation or substantially reduce the attenuation of the uplink signals. As mentioned above, because the received uplink signals may be much stronger than the downlink signals in the illustrated embodiment, even after the downlink signals have been amplified, the downlink signal power that may be included in the power detected by the common signal detector 524 may be substantially negligible compared to the power of the uplink signals when the attenuation of the uplink signals is ceased or substantially reduced.

Therefore, the control unit 522 may be configured to determine that the power levels detected by the common signal detector 524 may be substantially associated with the uplink signals when the attenuation of the uplink signals is ceased or substantially reduced. In other embodiments, such as when the amplified downlink signal power may not be negligible, the amplification applied by the downlink amplification path 515 may be reduced during uplink signal detection such that the amplified downlink power may be reduced. For example, in some embodiments, the gain of the downlink amplification path may be reduced or the downlink amplification path 515 may be turned off such that the downlink signals may not pass through the downlink amplification path 515 to be received by the common signal detector 524. Therefore, the signal booster 502 may be configured to detect the power of both uplink and downlink signals using the same signal detector (e.g., the common signal detector 524) even when the signal booster 502 may not include a common amplification path.

Modifications, additions, or omissions may be made to the signal booster 502 without departing from the scope of the present disclosure. For example, in embodiments where the downlink signals received by the signal booster 502 may be much stronger than the uplink signals received by the signal booster 502, the attenuation unit 526 and the common signal detector 524 may be communicatively coupled between the duplexer 512b and the second interface port 511 instead of between the duplexer 512a and the first interface port 509.

Additionally, in some embodiments, a first attenuation unit may be communicatively coupled between the first interface port 509 and the duplexer 512a. Also, a second attenuation unit may be communicatively coupled between the second interface port 511 and the duplexer 512b and/or the second attenuation unit may be communicatively coupled between the duplexer 512a and the common signal detector 524. In these embodiments, the common signal detector 524 may be communicatively coupled somewhere between the first and second attenuation units and such that the common signal detector 524 may receive both uplink and downlink signals. In these embodiments, the control unit 522 may direct the first attenuating unit to attenuate the uplink signals that may be received at the first interface port 509 to measure the power of the downlink signals and vice versa.

Further, in some embodiments, the signal booster 502 may also include one or more common amplification paths that may be configured to receive uplink and downlink signals that may be associated with different bands than the uplink and downlink signals that may be received by the uplink amplification path 517 and the downlink amplification path 515, respectively. Moreover, the placement of a common signal detector and an attenuation unit between a duplexer and an antenna port, such as shown in FIG. 5, may also be used in embodiments where a common amplification path may be included between the duplexer and the other antenna port, such as in the embodiments of signal boosters described above with respect to FIGS. 2-4. Additionally, in some embodiments, a common signal detector may be configured such that it may receive and detect different uplink and downlink signals transmitted in and associated with more than one communication band, as described in further detail below with respect to FIG. 6.

Figure 6:
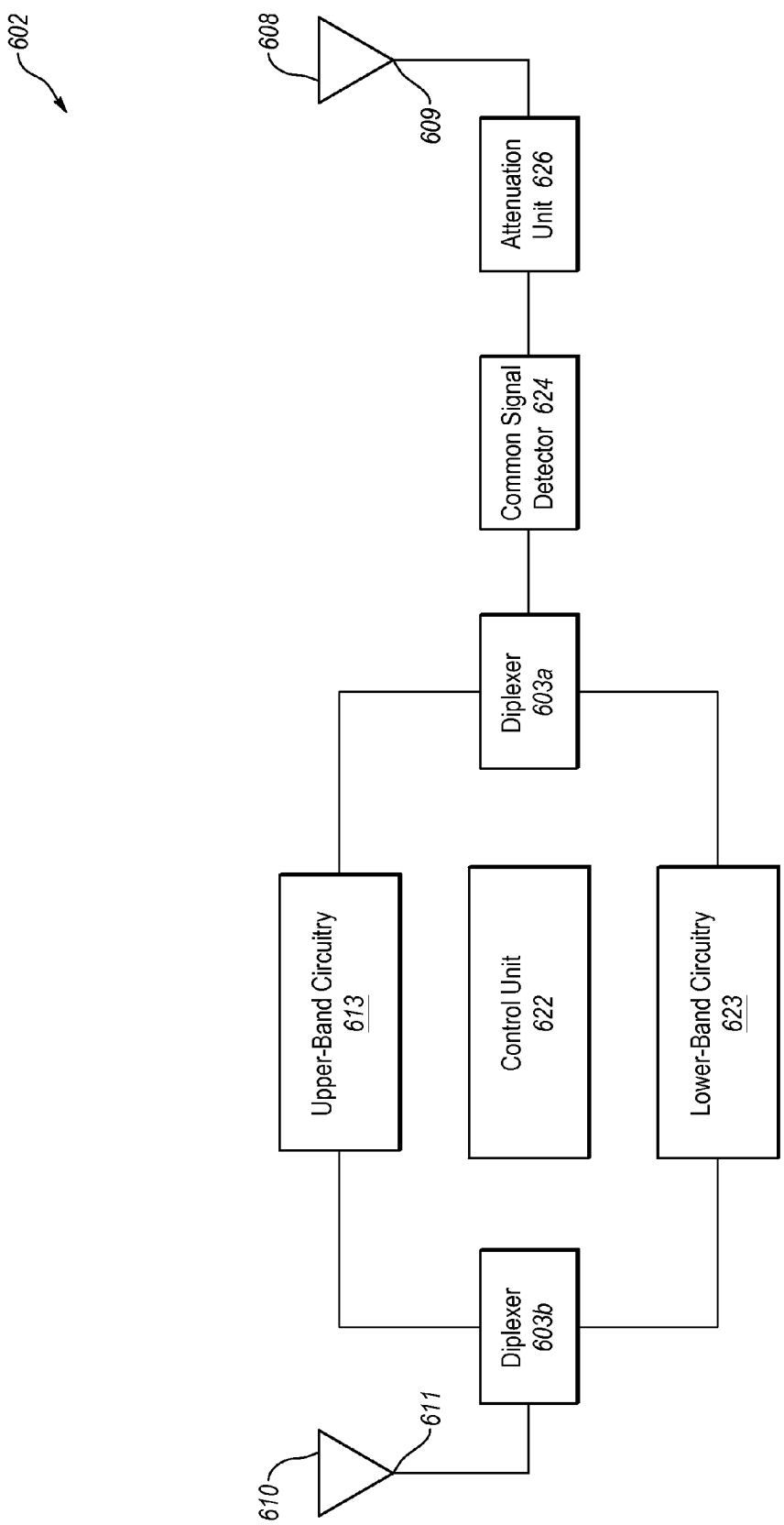

FIG. 6 illustrates an example embodiment of a bi-directional signal booster 602 (referred to hereinafter as "the signal booster 602") with a common signal detector 624, arranged in accordance with at least some embodiments described herein. In some embodiments, the signal booster 602 may be configured to operate in a manner analogous to the operation of the signal booster 102 of the system 100. The signal booster 602 may include a first interface port 609 communicatively coupled to a first antenna 608, a second interface port 611 communicatively coupled to a second antenna 610, and upper-band circuitry 613 and lower-band circuitry 623, each communicatively coupled between the first interface port 609 and the second interface port 611.

The upper-band circuitry 613 may be configured to receive and process (e.g., amplify) uplink and downlink signals that may be communicated in an upper frequency band that may be used by a wireless communication system. The uplink and downlink frequencies associated with the upper frequency band may be referred to hereinafter as "upper-band uplink signals" and "upper-band downlink signals." By way of example, in some embodiments, the upper-band circuitry 613 may be configured to process uplink and downlink signals transmitted in a 1,900 MHz frequency range.

In some embodiments, the upper-band circuitry 613 may include an uplink amplification path and a downlink amplification path that may be configured to receive and process the upper-band uplink and downlink signals in an analogous manner as described with respect to the uplink amplification path 517 and the downlink amplification 515, respectively, of FIG. 5 receiving and processing uplink and downlink signals. In these and other embodiments, the upper-band circuitry 613 may include a common direction amplification path configured to receive and process the upper-band uplink and downlink signals in an analogous manner as described with respect to one of the common direction amplification paths 219, 319, or 419 of FIGS. 2, 3, and 4, respectively, receiving and processing uplink and downlink signals.

The lower-band circuitry 623 may be configured to receive and process uplink and downlink signals that may be communicated in a lower frequency band that may be used by the wireless communication system. The uplink and downlink frequencies associated with the lower frequency band may be referred to hereinafter as "lower-band uplink signals" and "lower-band downlink signals." By way of example, in some embodiments, the lower-band circuitry 623 may be configured to process uplink and downlink signals transmitted in 700 MHz frequency range and/or an 800 MHz frequency range.

In some embodiments, the lower-band circuitry 623 may include an uplink amplification path and a downlink amplification path that may be configured to receive and process and the lower-band uplink and downlink signals in an analogous manner as described with respect to the uplink amplification path 517 and the downlink amplification 515, respectively, of FIG. 5 receiving and processing uplink and downlink signals. In these and other embodiments, the lower-band circuitry 623 may include a common direction amplification path configured to receive and process the lower-band uplink and downlink signals in an analogous manner as described with respect to one of the common direction amplification paths 219, 319, or 419 of FIGS. 2, 3, and 4, respectively, receiving and processing uplink and downlink signals.

The signal booster 602 may also include diplexers 603a and 603b. The diplexer 603a may be any suitable system, apparatus, or device configured to direct upper-band uplink signals and lower-band uplink signals that may be received at the first interface port 609 toward the upper-band circuitry 613 and the lower-band circuitry 623, respectively. The diplexer 603a may also be configured to receive upper-band downlink signals and lower-band downlink signals that may exit the upper-band circuitry 613 and the lower-band circuitry 623, respectively, and direct the upper-band and lower-band downlink signals toward the first interface port 609 and the first antenna 608. The diplexer 603b may be any suitable system, apparatus, or device configured to direct upper-band downlink signals and lower-band downlink signal that may be received at the second interface port 611 toward the upper-band circuitry 613 and the lower-band circuitry 623, respectively. The diplexer 603b may also be configured to receive upper-band uplink signals and lower-band uplink signals that may exit the upper-band circuitry 613 and the lower-band circuitry 623, respectively, and direct the upper-band and lower-band uplink signals toward the second interface port 611 and the second antenna 610.

In the illustrated embodiment, the signal booster 602 may also include a control unit 622, the common signal detector 624, and an attenuation unit 626. The control unit 622, the common signal detector 624, and the attenuation unit 626 may be analogous to the control unit 522, the common signal detector 524, and the attenuation unit 526, respectively, of the signal booster 502 of FIG. 5. In the illustrated embodiment, the common signal detector 624 may be communicatively coupled between the diplexer 603*a* and the attenuation unit 626 such that that the common signal detector 624 may receive upper-band downlink signals and lower-band downlink signals that may be output by the upper-band circuitry 613 and the lower-band circuitry 623, respectively. Additionally, the common signal detector 624 may receive upper-band uplink signals and lower-band uplink signals that may be output by the attenuation unit 626.

In the illustrated embodiment, and similar to that of FIGS. 4 and 5, the signal booster 602 may be configured for instances when uplink signals received by the signal booster 602 may be much stronger than the downlink signals. Therefore, to determine a power level of the downlink signals (upper-band and/or lower-band), the control unit 622 may direct the attenuation unit 626 to attenuate the uplink signals (upper-band and/or lower-band) that may be received at the first interface port 609 and that may pass through the attenuation unit 626 to the common signal detector 624. Therefore, downlink signals communicated to the common signal detector 624 from the diplexer 603*a* may be substantially stronger than the uplink signals communicated to the common signal detector 624 from the attenuation unit 626. As such, the control unit 622 may determine that the power detected by the common signal detector 624 may be associated with the downlink signals when the uplink signals are being attenuated.

Further, in some embodiments, to determine the power of the lower-band downlink signals, but not the upper-band downlink signals, in addition to attenuating the uplink signals via the attenuation unit 626, the control unit 622 may direct the upper-band circuitry 613 to modify the amplification that may be applied to the upper-band downlink signals such that the power that may be detected by the common signal detector 624 may largely be associated with the lower-band downlink signals. For example, the control unit 622 may direct the upper-band circuitry 613 to lower the gain applied to the upper-band downlink signals, open a switch configured such that when the switch is open the upper-band downlink signals may not reach the diplexer 603*a*, or turn off any suitable circuitry that may be configured to receive the upper-band downlink signals and may be configured such that when turned off, the upper-band downlink signals may not pass through the circuitry. The control unit 622 may perform analogous operations with respect to the lower-band circuitry 623 and lower-band downlink signals to detect the power of the upper-band downlink signals.

Additionally, similar to as described with respect to the signal boosters 402 and 502 of FIGS. 4 and 5, respectively, to determine a power level of the uplink signals (upper-band and/or lower-band), the control unit 622 may direct the attenuation unit 626 to cease or substantially reduce the attenuation of the uplink signals. As mentioned above, because the received uplink signals may be much stronger than the downlink signals in the illustrated embodiment, even after the downlink signals have been amplified, the downlink signal power that may be included in the power detected by the common signal detector 624 may be substantially negligible compared to the power of the uplink signals when the attenuation of the uplink signals is ceased or substantially reduced.

Therefore, the control unit 622 may be configured to determine that the power levels detected by the common signal detector 624 may be substantially associated with the uplink signals when the attenuation of the uplink signals is ceased or substantially reduced. In other embodiments, such as when the amplified downlink signal power may not be negligible, the amplification applied to the downlink signals may be reduced during uplink signal detection such that the amplified downlink power may be reduced. For example, in some embodiments, the gain applied to the upper-band and/or lower-band downlink signals may be reduced, one or more switches configured such that when the switches are open the upper-band downlink signals and/or lower-band downlink signals may not reach the diplexer 603*a* may be opened. In these or other embodiments, any suitable circuitry that may be configured to receive the upper-band downlink signals and/or the lower-band downlink signals and that may be configured such that when turned off the upper-band downlink signals may not pass through the circuitry may be turned off. Therefore, the signal booster 602 may be configured to detect the power of upper-band and lower-band uplink and downlink signals using the same signal detector (e.g., the common signal detector 624).

Modifications, additions, or omissions may be made to the signal booster 602 without departing from the scope of the present disclosure. For example, in embodiments where the downlink signals received by the signal booster 602 may be much stronger than the uplink signals received by the signal booster 602, the attenuation unit 626 and the common signal detector 624 may be communicatively coupled between the diplexer 603*b* and the second interface port 611 instead of between the diplexer 603*a* and the first interface port 609.

Additionally, in some embodiments, a first attenuation unit may be communicatively coupled between the first interface port 609 and the diplexer 603*a* and a second attenuation unit may be communicatively coupled between the second interface port 611 and the diplexer 603*b*. In these embodiments, the common signal detector 624 may be communicatively coupled between the first attenuation unit and the diplexer 603*a* or between the second attenuation unit and the diplexer 603*b*. Additionally, in these embodiments, the control unit 622 may direct the first attenuating unit to attenuate the uplink signals that may be received at the first interface port 609 to measure the power of the downlink signals and vice versa.

Moreover, in some embodiments, an upper-band common signal detector and an upper-band attenuation unit may be placed between the upper-band circuitry 613 and the diplexer 603*a* or diplexer 603*b*, or within the upper-band circuitry 613 (e.g., within a common amplification path of the upper-band circuitry 613). Therefore, the upper-band common signal detector may be configured to detect power associated with the upper-band uplink and downlink signals. In these or other embodiments, a lower-band common signal detector and a lower-band attenuation unit may be placed between the lower-band circuitry 623 and the diplexer 603*a* or diplexer 603*b*, or within the lower-band circuitry 623 (e.g., within a common amplification path of the lower-band circuitry 623). Therefore, the lower-band common signal detector may be configured to detect power associated with the lower-band uplink and downlink signals.

Further, the number of circuits associated with different communication bands within the signal booster 602 may vary without departing from the scope of the disclosure. For example, in some embodiments, the signal booster 602 may include a triplexer that may direct upper-band signals to the upper-band circuitry 613, that may direct mid-band signals to mid-band circuitry (not expressly depicted in FIG. 6), and that may direct lower-band signals to the lower-band circuitry 623.

Additionally, the use of the terms "upper-band" and "lower-band" is merely to differentiate between bands that may be associated with different frequency ranges. The difference in frequency between the upper-band and the lower-band may vary greatly depending on the particular application. For example, in some instances the upper-band may be the 800 MHz frequency range and the lower-band may be the 700 MHz frequency range. In other embodiments, the upper-band may be the 1,900 MHz frequency range and the lower-band may be the 700 MHz and/or the 800 MHz frequency range. Additionally, in some embodiments, the upper-band and the lower-band may both be included in the 700 MHz frequency range, the 800 MHz frequency range, the 1,900 MHz frequency range, or any other suitable frequency range.

Figure 7:
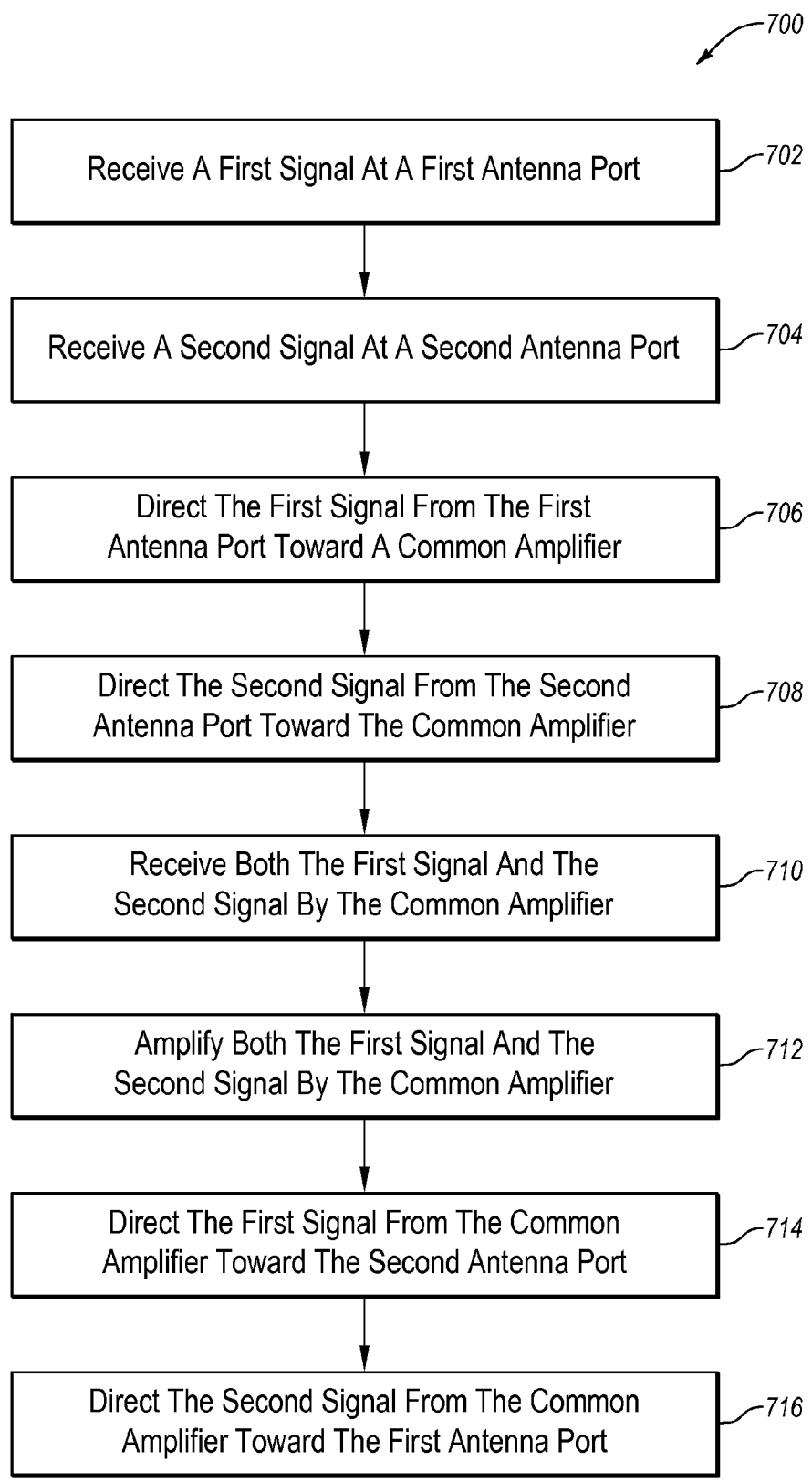
FIG. 7 is a flow chart of an example method of amplifying signals using a common amplifier.

FIG. 7 is a flow chart of an example method 700 of amplifying signals using a common amplifier, arranged in accordance with at least some embodiments described herein. One or more elements of the method 700 may be implemented, in some embodiments, by a bi-directional signal booster (referred to hereinafter as "the signal booster"), such as one of the signal boosters 102, 202, 302 or 402 of FIGS. 1-4, respectively. Although illustrated as discrete blocks, various blocks may be divided into additional blocks, combined into fewer blocks, or eliminated, depending on the desired implementation.

The method 700 may begin at block 702, where a first signal may be received at a first interface port of a signal booster. In some embodiments, the first signal may be an uplink signal, while in other embodiments the first signal may be a downlink signal. At block 704, a second signal may be received at a second interface port of the signal booster. In embodiments where the first signal may be an uplink signal, the second signal may be a downlink signal and in embodiments where the first signal may be a downlink signal, the second signal may be an uplink signal. In some embodiments, the first signal may be received at the first interface port in block 702 at approximately the same time that the second signal may be received at the second interface port in block 704. In other embodiments, the first signal may be received before the second signal or vice versa.

At block 706, the first signal may be directed from the first interface port toward a common amplifier of the signal booster. At block 708, the second signal may be directed from the second interface port toward the common amplifier of the signal booster. The common amplifier may be included in a common amplification path, such as one of the common amplification paths 219, 319, or 419 of FIGS. 2-4, respectively. In some embodiments, the first signal may be directed toward the common amplifier in block 706 at approximately the same time that the second signal may be directed toward the common amplifier in block 708. In other embodiments, the first signal may be directed before the second signal or vice versa.

At block 710, the first and second signals may both be received by the common amplifier. The first and second signals may both be received by the common amplifier at approximately the same time or may be received by the common amplifier at different times. At block 712, the common amplifier may amplify both the first and second signals. The common amplifier may amplify both the first and second signals at approximately the same time or at different times.

At block 714, the first signal may be directed from the common amplifier toward the second interface port. At block 716, the second signal may be directed from the common amplifier toward the first interface port. The operations performed at blocks 714 and 716 may be performed at approximately the same time or at different times. Additionally, operations performed at block 714 may be performed before the operations that may be performed at block 716 or the operations performed at block 716 may be performed before the operations that may be performed at block 714.

Accordingly, the method 700 may be used to amplify both the first and second signals using a common amplifier that may be included in a common amplification path. One skilled in the art will appreciate that, for this and other processes and methods disclosed herein, the functions performed in the processes and methods may be implemented in differing order. Furthermore, the outlined steps and operations are only provided as examples, and some of the steps and operations may be optional, combined into fewer steps and operations, or expanded into additional steps and operations without detracting from the essence of the disclosed embodiments. For instance, in some embodiments, the method 700 may further include steps associated with filtering the first signal and/or the second signal and individually amplifying or attenuating the first signal and/or the second signal.

Figure 8:
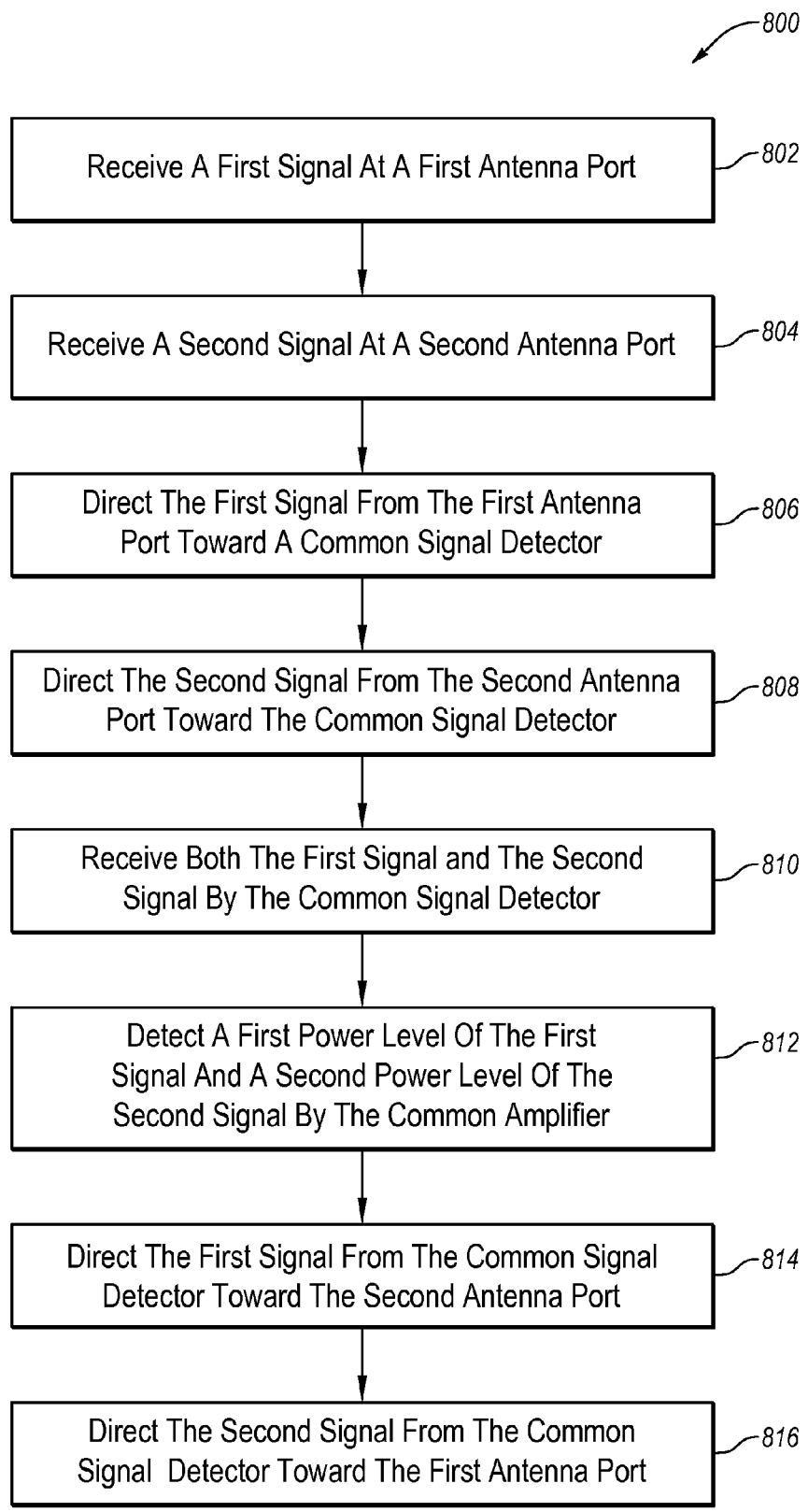
FIG. 8 is a flow chart of an example method of detecting signal power using a common signal detector.

FIG. 8 is a flow chart of an example method 800 of detecting signal power using a common signal detector, arranged in accordance with at least some embodiments described herein. One or more elements of the method 800 may be implemented, in some embodiments, by a bi-directional signal booster (referred to hereinafter as "the signal booster"), such as one of the signal boosters 102, 402, or 502 of FIGS. 1, 4, and 5, respectively. Although illustrated as discrete blocks, various blocks may be divided into additional blocks, combined into fewer blocks, or eliminated, depending on the desired implementation.

The method 800 may begin at block 802, where a first signal may be received at a first interface port of a signal booster. In some embodiments, the first signal may be an uplink signal, while in other embodiments the first signal may be a downlink signal. At block 804, a second signal may be received at a second interface port of the signal booster. In embodiments where the first signal may be an uplink signal, the second signal may be a downlink signal and in embodiments where the first signal may be a downlink signal, the second signal may be an uplink signal. In some embodiments, the first signal may be received at the first interface port in block 802 at approximately the same time that the second signal may be received at the second interface port in block 804. In other embodiments, the first signal may be received before the second signal or vice versa.

At block 806, the first signal may be directed from the first interface port toward a common signal detector of the signal booster. At block 808, the second signal may be directed from the second interface port toward the common signal detector of the signal booster. In some embodiments, the common signal detector may be included in a common amplification path, such as one of the common amplification paths 219, 319, or 419 of FIGS. 2-4, respectively. In other embodiments, the common signal detector may be communicatively coupled between a duplexer and the first interface port or the second interface port, such as described above with respect to the signal booster 502 of FIG. 5. In some embodiments, the first signal may be directed toward the common signal detector in block 806 at approximately the same time that the second signal may be directed toward the common signal detector in block 808. In other embodiments, the first signal may be directed toward the common signal detector before the second signal or vice versa.

At block 810, the first and second signals may both be received by the common signal detector. The first and second signals may both be received by the common signal detector at approximately the same time or may be received by the common signal detector at different times. At block 812, the common signal detector may detect a first power level of the first signal and may detect a second power level of the second signal.

At block 814, the first signal may be directed from the common signal detector toward the second interface port. At block 816, the second signal may be directed from the common signal detector toward the first interface port. The operations performed at blocks 814 and 816 may be performed at approximately the same time or at different times. Additionally, operations performed at block 814 may be performed before the operations that may be performed at block 816 or the operations performed at block 816 may be performed before the operations that may be performed at block 814.

Accordingly, the method 800 may be used to detect the power of the first and second signals using a common signal. One skilled in the art will appreciate that, for this and other processes and methods disclosed herein, the functions performed in the processes and methods may be implemented in differing order. Furthermore, the outlined steps and operations are only provided as examples, and some of the steps and operations may be optional, combined into fewer steps and operations, or expanded into additional steps and operations without detracting from the essence of the disclosed embodiments.

For instance, in some embodiments, the method 800 may further include steps associated with substantially attenuating the first signal to detect the second power level of the second signal and/or substantially attenuating the second signal to detect the first power level of the first signal. Additionally, the method 800 may include steps associated with filtering the first signal and/or the second signal and individually amplifying or attenuating the first signal and/or the second signal.

All examples and conditional language recited herein are intended for pedagogical objects to aid the reader in understanding the invention and the concepts contributed by the inventor to furthering the art, and are to be construed as being without limitation to such specifically recited examples and conditions. Although embodiments of the present disclosure have been described in detail, it should be understood that the various changes, substitutions, and alterations could be made hereto without departing from the spirit and scope of the present disclosure.

What is claimed is:

1. A bi-directional amplifier comprising:
   a first interface port configured to receive a first signal with a first frequency;
   a second interface port communicatively coupled to the first interface port and configured to receive a second signal with a second frequency that is different from the first frequency, the second interface port communicatively coupled to the first interface port such that the first signal propagates from the first interface port to the second interface port and such that the second signal propagates from the second interface port to the first interface port; and
   a common amplifier communicatively coupled between the first interface port and the second interface port such that the common amplifier is configured to receive and amplify both the first signal and the second signal.

2. The bi-directional amplifier of claim 1, further comprising:
   a first duplexer communicatively coupled between the first interface port and the common amplifier and configured to direct the first signal from the first interface port toward the common amplifier; and
   a second duplexer communicatively coupled between the second interface port and the common amplifier and configured to direct the second signal from the second interface port toward the common amplifier.

3. The bi-directional amplifier of claim 2, further comprising a third duplexer communicatively coupled between the common amplifier and the first duplexer and communicatively coupled between the common amplifier and the second duplexer, the third duplexer configured to direct the first signal from the common amplifier toward the second duplexer and direct the second signal from the common amplifier toward the first duplexer, wherein the first duplexer is configured to direct the second signal from the third duplexer toward the first interface port and the second duplexer is configured to direct the first signal from the third duplexer toward the second interface port.

4. The bi-directional amplifier of claim 3, further comprising one or more of:
   a first-signal amplifier communicatively coupled between the second duplexer and the third duplexer; and
   a second-signal amplifier communicatively coupled between the first duplexer and the third duplexer.

5. The bi-directional amplifier of claim 2, further comprising a third duplexer communicatively coupled between the first duplexer and the common amplifier and communicatively coupled between the second duplexer and the common amplifier, the third duplexer configured to direct the first signal from the first duplexer toward the common amplifier and configured to direct the second signal from the second duplexer toward the common amplifier.

6. The bi-directional amplifier of claim 5, further comprising one or more of:
   a first-signal amplifier communicatively coupled between the first duplexer and the third duplexer; and
   a second-signal amplifier communicatively coupled between the second duplexer and the third duplexer.

7. The bi-directional amplifier of claim 1, further comprising a splitting duplexer communicatively coupled to the common amplifier and configured to:
   receive, at a common port of the splitting duplexer, the first signal and the second signal after the first signal and the second signal are amplified by the common amplifier;
   filter the first signal and the second signal received at the common port;
   output the filtered first signal at a first-signal port of the splitting duplexer; and
   output the filtered second signal at a second-signal port of the splitting duplexer.

8. The bi-directional amplifier of claim 7, further comprising a combining duplexer communicatively coupled to the splitting duplexer and configured to:
   receive the filtered first signal at a first-signal port of the combining duplexer;
   receive the filtered second signal at a second-signal port of the combining duplexer;
   filter the filtered first signal;
   filter the filtered second signal; and
   output the re-filtered first signal and the re-filtered second signal at a common port of the combining duplexer.

9. The bi-directional amplifier of claim 1, further comprising:
a first filter communicatively coupled to the common amplifier, the first filter configured to receive the first signal and the second signal after the first signal and the second signal are amplified by the common amplifier and to filter the first signal and the second signal such that the first signal passes through the first filter and such that the second signal is filtered out by the first filter; and
a second filter communicatively coupled to the common amplifier and configured to receive the first signal and the second signal after the first signal and the second signal are amplified by the common amplifier and to filter the first signal and the second signal such that the second signal passes through the second filter and such that the first signal is filtered out by the second filter.

10. The bi-directional amplifier of claim 1, further comprising a radio frequency sensor configured to receive both the first signal and the second signal and to detect a power level of the first signal and the second signal.

11. A method for processing signals comprising:
receiving a first signal with a first frequency at a first interface port of a bi-directional amplifier
receiving a second signal with a second frequency that is different from the first frequency at a second interface port of the bi-directional amplifier;
directing the first signal from the first interface port toward a common amplifier of the bi-directional amplifier;
directing the second signal from the second interface port toward the common amplifier;
receiving both the first signal and the second signal by the common amplifier;
amplifying both the first signal and the second signal by the common amplifier;
directing the first signal from the common amplifier toward the second interface port; and
directing the second signal from the common amplifier toward the first interface port.

12. The method of claim 11, further comprising:
directing the first signal from the first interface port toward the common amplifier using a first duplexer communicatively coupled between the first interface port and the common amplifier; and
directing the second signal from the second interface port toward the common amplifier using a second duplexer communicatively coupled between the second interface port and the common amplifier.

13. The method of claim 12, further comprising:
directing the first signal from the common amplifier toward the second duplexer and directing the second signal from the common amplifier toward the first duplexer using a third duplexer communicatively coupled between the common amplifier and the first duplexer and communicatively coupled between the common amplifier and the second duplexer;
directing the second signal from the third duplexer toward the first interface port using the first duplexer; and
directing the first signal from the third duplexer toward the second interface port using the second duplexer.

14. The method of claim 13, further comprising one or more of:
amplifying the first signal between the second duplexer and the third duplexer; and
amplifying the second signal between the first duplexer and the third duplexer.

15. The method of claim 12 further comprising:
directing the first signal from the first duplexer toward a third duplexer communicatively coupled between the first duplexer and the common amplifier;
directing the second signal from the second duplexer toward the third duplexer, the third duplexer also communicatively coupled between the second duplexer and the common amplifier; and
directing the first signal from the third duplexer toward the common amplifier; and
directing the second signal from the second duplexer toward the common amplifier using the third duplexer.

16. The method of claim 15, further comprising one or more of:
amplifying, by a first-bi-directional amplifier, the first signal directed toward the third duplexer by the first duplexer; and
amplifying, by a second-bi-directional amplifier, the second signal directed toward the third duplexer by the second duplexer.

17. The method of claim 11, further comprising:
filtering the first signal by a splitting duplexer communicatively coupled to the common amplifier;
filtering the second signal by the splitting duplexer;
outputting the filtered first signal at a first-signal port of the splitting duplexer; and
outputting the filtered second signal at a second-signal port of the splitting duplexer.

18. The method of claim 17, further comprising:
filtering the filtered first signal by a combining duplexer communicatively coupled to the splitting duplexer;
filtering the filtered second signal by the combining duplexer; and
outputting the re-filtered first signal and the re-filtered second signal at a common port of the combining duplexer.

19. The method of claim 11, further comprising:
filtering the first signal by a first filter communicatively coupled to the common amplifier; and
filtering the second signal by a second filter communicatively coupled to the common amplifier.

20. The method of claim 11, further comprising detecting a power level of each of the first signal and the second signal by a radio frequency sensor configured to receive both the first signal and the second signal.

* * * * *